(12) United States Patent
Tomoda (10) Patent No.: US 9,119,332 B2
(45) Date of Patent: Aug. 25, 2015

(54) METHOD OF MOUNTING DEVICES IN SUBSTRATE AND DEVICE-MOUNTING SUBSTRATE STRUCTURE THEREOF

(75) Inventor: Katsuhiro Tomoda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 425 days.

(21) Appl. No.: 13/084,252

(22) Filed: Apr. 11, 2011

(65) Prior Publication Data
US 2011/0266039 A1     Nov. 3, 2011

(30) Foreign Application Priority Data

Apr. 28, 2010   (JP) ................... 2010-103142

(51) Int. Cl.
| | |
|---|---|
| *H05K 1/16* | (2006.01) |
| *H05K 3/30* | (2006.01) |
| *H05K 3/32* | (2006.01) |
| *H01L 23/00* | (2006.01) |
| *H01L 21/56* | (2006.01) |

(52) U.S. Cl.
CPC ............ *H05K 3/305* (2013.01); *H01L 24/73* (2013.01); *H01L 24/82* (2013.01); *H01L 24/83* (2013.01); *H01L 24/92* (2013.01); *H05K 3/32* (2013.01); *H01L 21/563* (2013.01); *H01L 2224/16225* (2013.01); *H01L 2224/241* (2013.01); *H01L 2224/24011* (2013.01); *H01L 2224/24051* (2013.01); *H01L 2224/2499* (2013.01); *H01L 2224/24226* (2013.01); *H01L 2224/25175* (2013.01); *H01L 2224/2919* (2013.01); *H01L 2224/32225* (2013.01); *H01L 2224/73204* (2013.01); *H01L 2224/73217* (2013.01); *H01L 2224/82002* (2013.01); *H01L 2224/82101* (2013.01); *H01L 2224/82138* (2013.01); *H01L 2224/82143* (2013.01); *H01L 2224/82986* (2013.01); *H01L 2224/83193* (2013.01); *H01L 2224/83871* (2013.01); *H01L 2224/9205* (2013.01); *H01L 2224/92144* (2013.01); *H01L 2924/00013* (2013.01); *H01L 2924/01029* (2013.01); *H01L 2924/12041* (2013.01); *H05K 2201/09909* (2013.01); *H05K 2201/10106* (2013.01); *H05K 2203/072* (2013.01); *H05K 2203/1581* (2013.01)

(58) Field of Classification Search
None
See application file for complete search history.

(56) References Cited

U.S. PATENT DOCUMENTS

| | | | | |
|---|---|---|---|---|
| 4,339,785 | A | * | 7/1982 | Ohsawa ...................... 361/779 |
| 5,071,787 | A | * | 12/1991 | Mori et al. ..................... 29/840 |
| 5,089,440 | A | * | 2/1992 | Christie et al. ................ 29/841 |

(Continued)

FOREIGN PATENT DOCUMENTS

| | | |
|---|---|---|
| JP | 1995-183304 | 7/1995 |
| JP | 2008-124376 A | 5/2008 |

OTHER PUBLICATIONS

JP 2005-311109 English translation.*

(Continued)

*Primary Examiner* — Tuan T Dinh
*Assistant Examiner* — Steven T Sawyer
(74) *Attorney, Agent, or Firm* — Dentons US LLP (57) ABSTRACT

An assembly including a substrate, a metal wiring layer on the substrate, the metal wiring layer having an opening therein, a thermosetting resin layer on at least a portion of the substrate overlapping the opening of the metal wiring layer, and a device on the resin layer, the device positioned over the opening of the metal wiring layer and bonded to the substrate via the resin layer.

3 Claims, 10 Drawing Sheets

(56) References Cited

U.S. PATENT DOCUMENTS

| | | | |
|---|---|---|---|
| 5,151,776 A * | 9/1992 | Wojnarowski et al. | 257/712 |
| 5,271,548 A * | 12/1993 | Maiwald | 228/175 |
| 5,405,809 A * | 4/1995 | Nakamura et al. | 438/64 |
| 5,895,971 A * | 4/1999 | Nakanishi | 257/701 |
| 5,965,947 A * | 10/1999 | Nam et al. | 257/783 |
| 6,445,589 B2 * | 9/2002 | Chengalva | 361/760 |
| 6,981,317 B1 * | 1/2006 | Nishida | 29/840 |
| 8,318,595 B2 * | 11/2012 | Morris et al. | 438/613 |
| 2004/0262033 A1 * | 12/2004 | Chiu et al. | 174/256 |
| 2005/0034888 A1 * | 2/2005 | Hoffmann et al. | 174/52.4 |
| 2005/0146854 A1 * | 7/2005 | Ikuta et al. | 361/719 |
| 2005/0253231 A1 * | 11/2005 | Liu | 257/678 |
| 2006/0049516 A1 * | 3/2006 | Wang et al. | 257/734 |
| 2007/0132099 A1 * | 6/2007 | Hashimoto | 257/737 |
| 2007/0221711 A1 * | 9/2007 | Wada et al. | 228/248.1 |
| 2008/0038855 A1 * | 2/2008 | Watanabe et al. | 438/34 |

OTHER PUBLICATIONS

Chinese Office Action dated Nov. 4, 2014, issued in connection with counterpart Chinese Patent Application No. 201110100274.4.

* cited by examiner

FIG. 1A
SEED FORMATION

FIG. 1B
COAT PHOTOSENSITIVE
RESIN

FIG. 1C
EMBED DEVICE

FIG. 1D
SELF-ALIGNMENT

FIG. 1E
EXPOSE ENTIRE SURFACE
FROM REAR SIDE

FIG. 1F
DEVELOPMENT

FIG. 1G
ELECTROLYTIC
PLATING

FIG.5A
SEED FORMATION

FIG.5B
COAT PHOTOSENSITIVE RESIN

FIG.5C
EMBED DEVICE

FIG.5D
SELF-ALIGNMENT

FIG.5E
EXPOSURE
(SURFACE MASK)

FIG.5F
DEVELOPMENT

FIG.5G
RESIST PATTERNING
ELECTROLYTIC PLATING

METHOD OF MOUNTING DEVICES IN SUBSTRATE AND DEVICE-MOUNTING SUBSTRATE STRUCTURE THEREOF

RELATED APPLICATION DATA

The present application claims priority to Japanese Patent Application JP 2010-103142 filed in the Japan Patent Office on Apr. 28, 2010, the entirety of which is hereby incorporated by reference to the extent permitted by law.

BACKGROUND OF THE INVENTION

In accordance with principles of the invention generally relates to a method of mounting devices on a substrate and a device-mounting substrate structure thereof, in which terminal connection of the devices is performed by using a wiring line of the substrate as a seed metal using electrolytic plating.

In order to mount devices such as a semiconductor chip or a separate component in a wiring substrate made of a semiconductor or resin, the device may be mounted in one surface or both surfaces of a single wiring substrate as in a typical print wiring substrate, or may be mounted in a multilayered wiring substrate.

Among them, in order to manufacture a multi-layered wiring substrate, there is known a method (build-up) in which the device is mounted in a conductive layer formed in one surface of the base substrate, and a multi-layered substrate is built up in a single side by repeating formation of the inter-layered insulation layer, formation of the wiring line, and device mounting. In addition, there is also a known method of, for both surfaces of the core substrate, forming the wiring line, forming the inter-layered insulation layer, and performing device mounting.

A method of stacking other bare chips on a semiconductor substrate (base chip) while connection between terminals is obtained is also a type of the build-up method.

In the case where the devices are mounted in the wiring substrate, particularly, in the case where devices to be mounted are minute and plural, a technique of collectively arranging (transferring) a plurality of devices in the wiring substrate with a high precision is important.

Such a device-transferring technique is disclosed, for example, in JP-A-2004-273596. In this disclosure, a device is held in the resin layer on a first substrate, the first substrate is bonded to a second wiring line from the side of the resin layer while the device is held, and exfoliation is performed at the interface between the resin layer and the first substrate, so that the devices are collectively transferred to a second separate substrate.

Such a device transferring method is particularly effective when the substrate area is significantly large. In addition, the method of holding the devices in the resin layer and collectively transferring the devices into a separate substrate is further effective when a significantly large amount of devices are to be regularly arranged with a high precision.

JP-A-2004-273596 discloses a method of manufacturing an LED display in which light is emitted from the LED device for this purpose.

However, it is desirable to provide robust bonding between the electrode pad of the device and the wiring line both mechanically and electrically after arranging the devices in the wiring substrate regardless of whether the devices are mounted in a single-layered substrate or a multi-layered substrate without being limited to a case where such devices are collectively transferred.

In this regard, Japanese Patent No. 3956955 and JP-A-2005-311109 disclose an electroless plating method as a method of connecting the devices and the wiring substrate.

JP-A-2004-273596 discloses a method of connecting terminals between the wiring substrate and the mounted devices using electroless plating in examples thereof.

In addition, according to JP-A-2005-311109, a material called an under-fill is coated on the wiring substrate using a micro-dispenser or the like, and devices (semiconductor laser) are bonded thereon. The devices are arranged using an apparatus capable of obtaining alignment such as a flip-chip bonder. In this case, a gap between the device pad and the wiring line is formed to be several to ten micrometers μm, and the electroless plating process is performed in this state.

SUMMARY OF THE INVENTION

As described in Japanese Patent No. 3956955, when the wiring substrate and the electrodes on the upper surface of device placed thereto are connected using an electroless plating method, the plating deposition from the wiring line and the plating deposition from the electrode pad are simultaneously grown. In this course, as the plating layers approach from both sides, a resulting structure in which a plating solution is difficult to introduce is made. Therefore, deposition to increase the thickness later. As a result, a so-called micro-gap is generated in those portions. If the plating layer is not grown to a thickness of 10 to 30 μm in order to fill the gap, it is difficult to appropriately connect two conductive layers (including the wiring line and the electrode pad). In addition, even when the gap is temporarily filled, a portion having a weak mechanical strength may be generated.

According to JP-A-2005-311109, two conductive layers (including the wiring line and the device electrode pad) face plane-to-plane, and the gap therebetween is as narrow as several to ten micrometers μm. Therefore, it is thought that it is relatively difficult to generate a gap. Even in this case, since deposition is made from both directions using electroless plating, an intermittent deposition interface is generated, where the mechanical strength is not sufficient therein.

However, in the connection structure according to the build-up method described above, it is necessary to form an inter-layer insulation film after mounting the device and form a via-hole or the like. Therefore, it is necessary to provide thermal resistance in the device. In addition, the cost of the insulation film itself is also high.

In addition, in the case where the device is minute, and the electrode pad is formed in both the upper and lower surfaces, the following processes are not necessary in typical build-up connection.

First, the device is mounted in the substrate, and the electrode pad is formed on the surface of the device. Then, the other substrate is bonded from the surface where the electrode pad is formed by interposing the device. Then, the substrate where the device has been initially mounted is removed so that the electrode pad is formed on the other surface facing the surface of the device where the electrode pad is formed.

In such a build-up connection method, the number of processes is large, and accordingly, the product yield is degraded.

If the device is a light-emitting device, and is a top emission type in which light is emitted to the front surface side of the substrate, lightfastness is necessary in the material used in the build-up. In addition, in the case of the bottom emission type in which light is emitted to the rear surface side, lightfastness is necessary in the material used in the mounting. Therefore, it is difficult to implement a material satisfying both conditions. Particularly, in a micro-LED display in which a light density is as much as 100 times or more higher than those of other displays, only a small number of limited materials satisfy such conditions.

Disclosed herein are one or more providing a method of mounting devices in a substrate and a device-mounting substrate structure capable of obtaining robust bonding between the wiring substrate and the device electrode using electrolytic plating as a novel connection method in place of the aforementioned build-up connection.

In one embodiment, there is an assembly including a substrate, a metal wiring layer on the substrate, the metal wiring layer having an opening therein, a thermosetting resin layer on at least a portion of the substrate overlying the opening of the metal wiring layer and a device on the resin layer, the device positioned over the opening of the metal wiring layer and bonded to the substrate via the resin layer.

In another embodiment, the device further includes a photo-curable area around the device.

In another embodiment, the device includes a plating layer on the metal wiring layer, the plating layer effective to electrically connect the wiring layer and the device.

In another embodiment, there is a method including the steps of providing a substrate with a metal wiring layer on one surface thereof, the metal wiring layer having an opening therein, forming a thermosetting resin layer on at least a portion of the substrate overlying the opening of the metal wiring layer, positioning a device on the resin layer so that the device is over the opening of the metal wiring layer, and removing the non-exposed resin layer.

In another embodiment, the method further includes the step of heating the resin layer.

In another embodiment, the method further includes the step of curing the resin by exposing at least one portion of the resin layer to a curing energy, the exposure initiated from a surface of the substrate facing away from the surface having the metal wiring layer.

In another embodiment, the method includes the step of partially curing an area of the thermosetting resin layer by exposing at least one portion of the resin layer to a curing energy to form a photo-curable area around the device.

In another embodiment, the method includes the step of forming a plating layer on the metal wiring layer by electrolytic plating the metal wiring layer with an electric current, the plating layer effective to electrically connect the wiring layer and the device.

In another embodiment, there is an electronic apparatus that includes an assembly. The assembly includes a substrate, a metal wiring layer on the substrate, the metal wiring layer having an opening therein, a thermosetting resin layer on at least a portion of the substrate overlying the opening of the metal wiring layer, and a device on the resin layer, the device positioned over the opening of the metal wiring layer and bonded to the substrate via the resin layer.

In another embodiment, the assembly further includes a photo-curable area around the device.

In another embodiment, the assembly further includes a plating layer on the metal wiring layer, the plating layer effective to electrically connect the wiring layer and the device.

DETAILED DESCRIPTION OF THE PRESENTLY PREFERRED EMBODIMENTS

The presently preferred embodiments according to principles of the present invention(s) will be described in detail hereinafter with reference to the accompanying drawings. Although the presently preferred embodiments will be described below with various technically preferred limitations, the scope(s) of the present invention(s) as set forth in the claims is/are not limited thereto unless otherwise described below.

Presently preferred embodiments of the present invention relate to a technique of performing electrolytic plating by using a seed metal on a wiring substrate as an electric feeding layer. Presently preferred embodiments disclose a structure and a method for obtaining electrical connection between the seed metal and the electrode pad of the device positioned in the upward direction from the seed metal using electrolytic plating in this case.

The device is held by the resin, and resin except for the necessary portions are removed so that the device is temporarily fixed to the wiring substrate. Connection is obtained by electrolytic plating thereafter.

The following presently preferred embodiments include a method of fixing the device during plating, particularly, a positional relationship between the electrode and the seed metal, a temporary fixing method, a method of removing an unnecessary portion, a device structure appropriate to the plating, or the like. Hereinafter, description will be made from these viewpoints.

FIGS. 1A to 1G are cross-sectional views illustrating a method of mounting devices in a substrate according to principles of the present invention(s).

First, a device-mounting substrate structure will be described with reference to FIG. 1G.

In an LED display, a plurality of LED chips, for example, semiconductor LED chips for red, green, and blue (RGB) colors are mounted in advance in a panel substrate as color pixel light-emitting unit. For example, in a full HD specification, approximately two million LED chips are mounted. Such a color pixel light-emitting unit is hereinafter called a "trio chip." The trio chip corresponds to an example of the "color pixel chip" according to the embodiment of the invention.

Figure 1A:
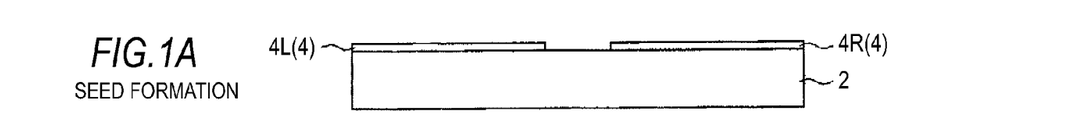
FIGS. 1A to 1G are cross-sectional views illustrating a method of mounting devices in a substrate according to principles of the present invention(s).
Figure 1B:
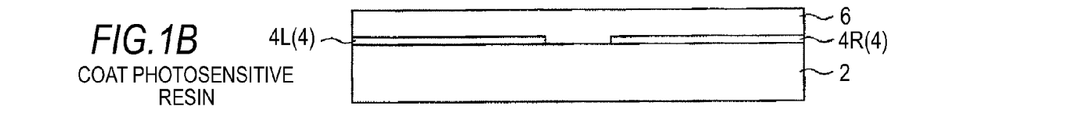
Figure 1C:
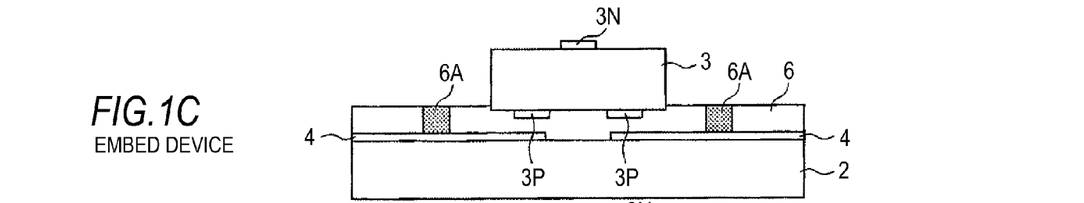
Figure 1D:
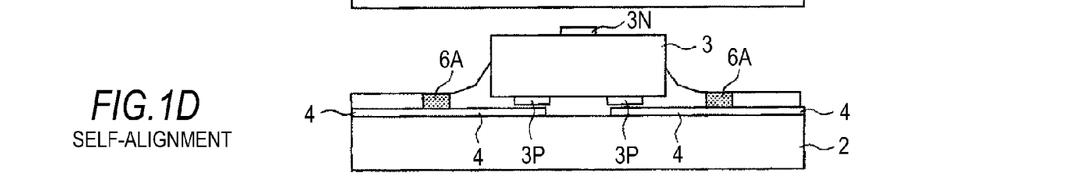
Figure 1E:
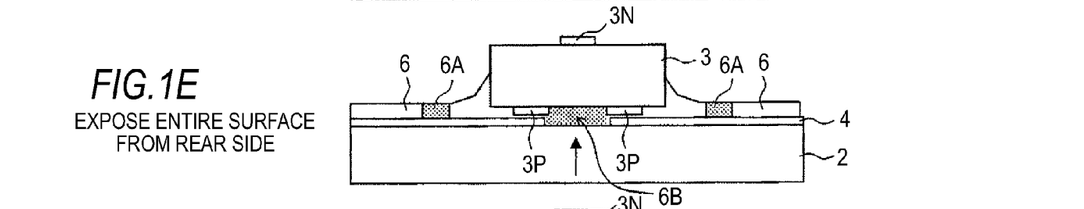
Figure 1F:
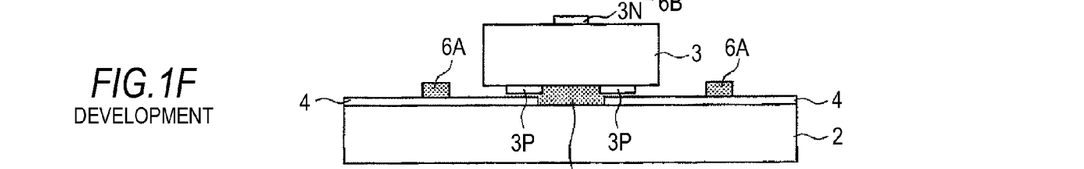
Figure 1G:
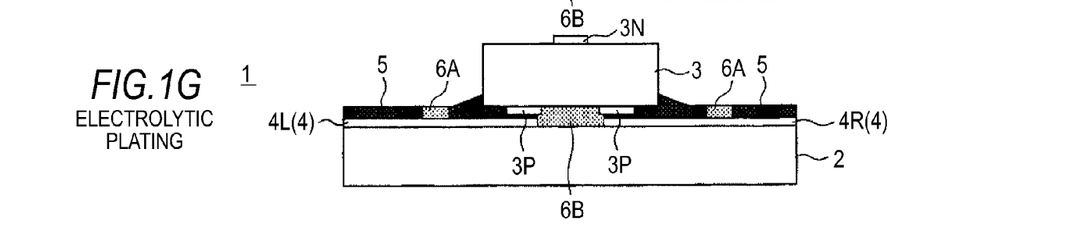

FIG. 1G illustrates an appearance of a single monochromatic light-emitting diode (LED) semiconductor chip which is mounted in the trio chip substrate when the trio chip is formed. In a structure similar to the illustrated mounted structure, semiconductor chips emitting light of another two colors are added so that three semiconductor chips are arranged side-by-side.

While the trio chip 1 shown in FIG. 1G is obtained by mounting a semiconductor chip (an LED chip 3) in a transparent substrate such as quartz glass (referred to as a trio substrate 2 or a chip arrangement substrate), formation of the trio chip 1 will be described in brief hereinafter before description of the mounting process.

The LED chip 3 of RGB is an example of a "device" according to a presently preferred embodiment and is a light-emitting diode device including a nitride semiconductor-based material such as gallium nitride.

For example, the LED chip 3 has a double-hetero structure in which an active layer is interposed between the p-clad layer and the n-clad layer. In addition, the LED chip 3 illustrated herein has an approximately flat panel shape, and the active layer and the clad layer of the LED chip 3 extend on a plane parallel to the main surface of the substrate made of sapphire or the like for growing them. Such a layer is formed by depositing a gallium nitride crystal layer or the like.

In such a type of semiconductor layer, it is necessary to at least partially change the light-emitting wavelength, and thus, it is difficult to simultaneously form three LED chips 3 of red, green, and blue colors on the same substrate. The size thereof is very small to the extent that the height reaches several micrometers, or one side or the diameter reaches several tens of micrometers. The portion corresponding to such a chip is formed through a semiconductor process on epitaxial growth wafers of each color to provide a very thin wafer thickness, and then transferred to another substrate in a receiving side to have an arrangement pitch larger than the pitch formed on the wafer. In this transferring process, a method of laser punching is used.

So-called color arrangement is aligned by performing such chip transferring for each color. In this color arrangement, the LED chips of RGB are adjacently arranged side by side. The substrate having the LED chips 3 arranged side by side by repeating the color pixel units arranged side by side through such a color arrangement is transferred and removed to/from another substrate to form another electrode so that different electrodes are (a P-electrode corresponding to the anode and an N-electrode corresponding to cathode) are formed on both surfaces.

In this manner, the device's side to be mounted in the trio substrate 2 is prepared in advance.

In FIG. 1G, this LED chip 3 is placed on the mounting surface of the trio substrate 2, for example, from the side of the P-electrode 3P. Meanwhile, the N-electrode 3N is formed on the surface of the LED chip 3.

On the mounting surface of the trio substrate 2, wiring layers 4R and 4L serving as a seed metal during the plating (hereinafter, referred to as a metal wiring layer 4 if not specified) is formed in advance. Although the wiring layers 4R and 4L are separately illustrated in the drawing, they have at least the same electric potential. The wiring layers 4R and 4L may be connected and constructed as a plane pattern.

The metal wiring layer 4 is a wiring line made of, for example, Ti/Au or the like and is formed through existing methods including deposition, lithography (including exposure and development), and etching.

The LED chip 3 is bonded to the metal wiring layer 4 by interposing the electrolytic plating layer 5. The electrolytic plating layer 5 is grown from the entire area of the exposed surface of the metal wiring layer 4, and a part thereof creeps up the skirt portion of the side surface of the LED chip 3. As a characteristic point, the electrolytic plating layer 5 is filled in the gap facing between the metal wiring layer 4 and the P-electrode 3P of the LED chip 3 or nearly filled in the corresponding gap.

In addition, while the electrolytic plating layer 5 creeps up the side surface of the LED chip 3 in FIG. 1G, it does not necessarily creep depending on the thickness of the plating layer or the like.

In order to form such a structure, in FIG. 1A, the wiring layers 4R and 4L are formed on one principal surface of the trio substrate 2 by sequentially performing, for example, sputtering, resist-formation, exposure, development, and etching.

Referring to the cross-section of FIG. 1A, the wiring layers 4R and 4L are separated from each other in the portion where the LED chip 3 is mounted. For example, the wiring layers 4R and 4L are a part of a single metal wiring layer, and an opening having a size of approximately 4×4 µm is formed in the metal wiring layer.

Referring to FIG. 1B, resin (preferably, photosensitive resin) is coated to have a thickness of, for example, approximately, 1.5 µm on the metal wiring layers 4 (including 4R and 4L) that have been formed. The resin is plastic resin that is cured by external factors such as heating or light illumination. Here, thermosetting photosensitive resin 6 is used. The thermosetting photosensitive resin 6 is formed by bonding resin having a sheet shape or coating resin through spin-coating or the like and volatizing a solvent in a pre-bake or the like. In addition, while a transferring and removing method from another substrate may be employed, since the thermosetting photosensitive resin 6 has a relatively thin thickness, and it is not necessary to bury devices or convex-concave portions, it may be sufficiently formed through sheet bonding or spin coat.

Here, a photo-curable area 6A is formed in a portion around the LED chip 3 shown in FIG. 1C through partial exposure of this portion. The partial exposure may be performed using an ion beam or the like in addition to typical methods using a mask.

Referring to FIG. 1C, the LED chip 3 prepared in advance is placed on the thermosetting photosensitive resin 6. In this case, the positioning against the metal wiring layer 4 is not particularly limited.

Referring to FIG. 1D, the entire trio chip of this state is heated, for example, to a temperature of 50° C. for approximately 30 minutes. The heating temperature or time may be determined within a range appropriate to the characteristic of resin. Through the heating, viscosity of the resin is reduced, and the resin creeps up the side wall of the LED chip 3 so that a fillet is formed. Since the molecules of the heated resin tend to settle down in a lowest energy state, the resin applies a force to press the entire LED chip 3 down in the fillet. If the LED chip 3 is pressed down, the resin directly underlying the P-electrode 3P is extruded to the outer side thereof, and the P-electrode 3P approaches the metal wiring layer 4.

By virtue of such a force, the gap between the P-electrode 3P and the metal wiring layer 4 deviated by 0.2 to 1.5 μm between the RGB chips when they were initially placed is reduced to 0 to 0.3 μm to absorb the deviation.

However, as the P-electrode 3P approaches a certain point near the metal wiring layer 4, since a large amount of energy is necessary to perfectly remove the resin, it is difficult to approach beyond this point. For this reason, the P-electrode 3P and the metal wiring layer 4 settle down with a thin gap. In addition, even when the P-electrode 3P and the metal wiring layer 4 make contact with each other, it is difficult to abut on the entire surfaces, and they are just partially close to each other at maximum.

As a result, while self-alignment of the devices for the wiring line can be implemented, it is preferable to provide a photo-curable area 6A in order to prevent the softened resin from escaping to the outside and improve the effectiveness. While the photo-curable area 6A is preferably formed to surround the circumference of the LED chip 3, they may be intermittently broken into a plurality of pieces.

In addition, if the photo-curable area 6A is aligned with respect to the metal wiring layer 4 with a high precision, the thermosetting photosensitive resin 6 is also self-aligned in an xy-direction with respect to the connection of the metal wiring layer 4.

Referring to FIG. 1E, preferably, the thermosetting photosensitive resin 6 is exposed from the rear surface of the trio substrate 2 which is optically transparent. In this case, the metal wiring layer 4 serves as a self-alignment mask layer so that the resin portion is cured at the area between the wiring layers 4R and 4L. The cured resin portion serves as a "temporary fixing portion."

In addition, when the self-alignment mask obtained by the metal wiring layer 4 is not sufficient, a mask path or a beam exposure area such as EB may be limited. Particularly, in order to perform the rear-surface exposure during delivery as described below, it is preferable that only the metal wiring layer 4 is used as a mask layer.

Referring to FIG. 1F, the non-exposed portions are removed through development. In this case, the resin in the gap between the P-electrode 3P and the metal wiring layer 4 is blocked by the metal wiring layer 4 and not exposed. Therefore, the developing solution is resolved, and the non-exposed resin portions in this place are removed. Since a device is held in the temporary fixing portion having a high strength, such a gap is maintained.

In addition, electrolytic plating is performed as shown in FIG. 1G. During the electrolytic plating, an electric current of 10 mA/cm2 flows through the electrolytic plating solution with the positive electrode plate by applying, for example, a voltage of 0.5 to 1.0 V to the metal wiring layer 4 corresponding to the negative electrode and electrolytic solution. As a result, as shown in FIG. 1G, a plating growth is initiated, and an electrolytic plating layer 5, for example, having a thickness of 0.5 μm is finally formed. As a result, the metal wiring layer 4 and the P-electrode 3P are robustly connected both mechanically and electrically.

Figure 2:
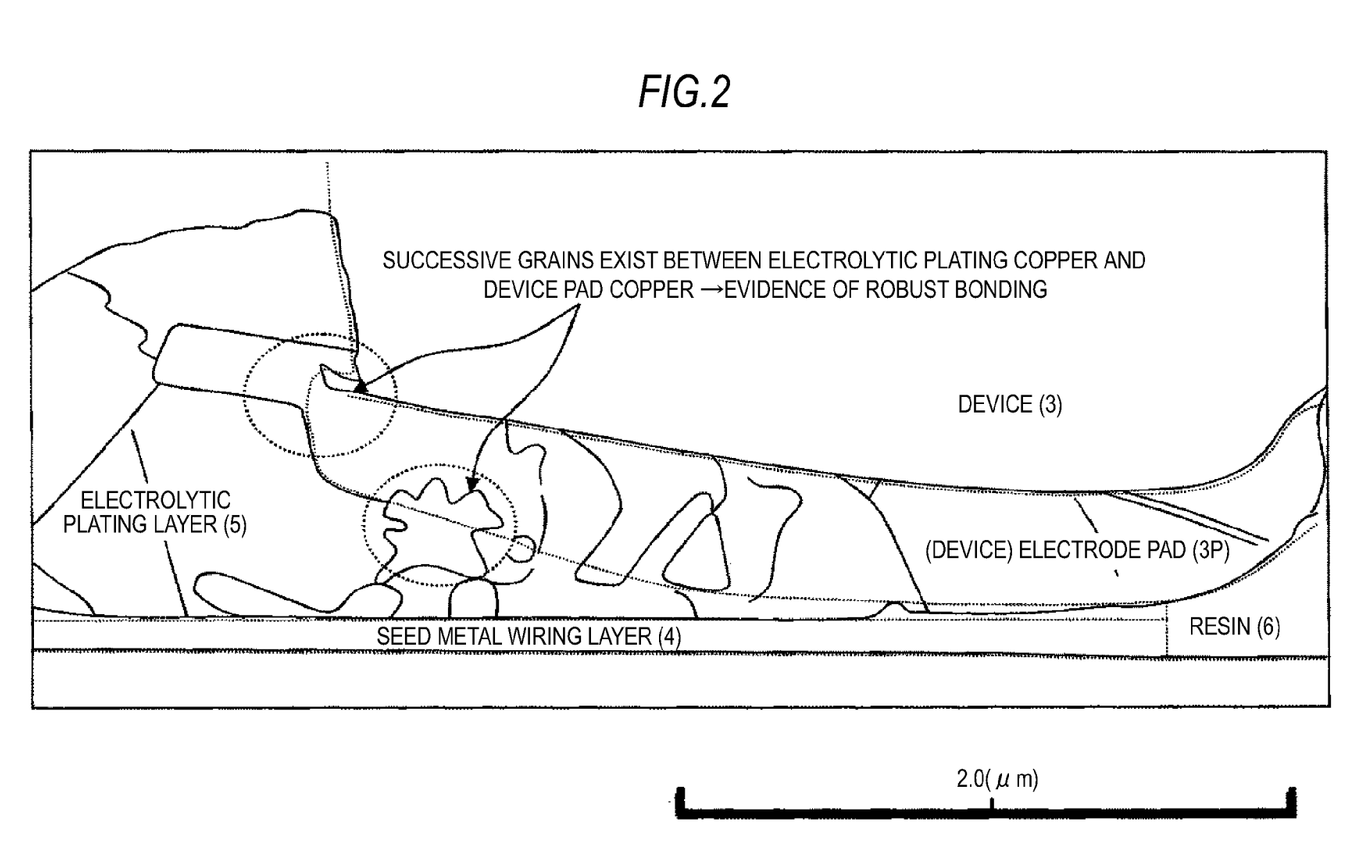
FIG. 2 is a diagram illustrating an appearance of a connection between the metal wiring layer and the P-electrode according to principles of the present invention(s).

FIG. 2 is a schematic diagram illustrating an appearance of the connection between the metal wiring layer 4 and the P-electrode 3P taken by SIM photographing of a real sample.

Referring to FIG. 2, it is recognized that continuous grains are provided in the portion surrounded by a circle. As a result, robust bonding is obtained.

According to this method, the metal wiring layer 4 and the P-electrode 3P corresponding to two objects bonded by plating are not initially connected electrically. Furthermore, the P-electrode 3P is positioned in the upward direction, which is a principal direction of the plating, from the metal wiring layer 4. According to this embodiment, the P-electrode 3P is positioned in the upper direction from the metal wiring layer 4 so that they nearly face each other.

Since they are not connected electrically, the plating is initially grown from the metal wiring layer 4. However, since the growth apical face of the plating is usually rounded, a portion initially making contact with the electrode pad is limited to a point or a significantly limited area.

Following the electric contact, the plating grows from both the metal wiring layer 4 and the P-electrode 3P making contact with the metal wiring layer 4, and the contact surface is gradually widened.

In this manner, if the plating is gradually widened from a certain narrow range, generation of voids is suppressed, and it is easy to obtain grains which are more integrated as a composition. For this reason, in comparison with electrolytic plating or electroless plating in which the plating starts while two bonding targets make contact with each other, it is possible to obtain robust bonding both mechanically and electrically.

In addition, it is also advantageous that thermal or mechanical damage is not applied to devices to obtain bonding through the plating at a room temperature.

In addition to the plating, the following advantages can be obtained.

Since a functional device can be formed on the upper surface of the device, and a terminal can be formed on the lower surface, it is possible to miniaturize the device and reduce costs.

In the case of the device in which light is emitted from the upper surface of device, since the wiring line is not formed on the upper surface of the device unlike the build-up connection, the light-emitting area of the light-emitting device is not limited by the terminal of the device and the wiring line. In addition, it does not degrade output power of the light-emitting device or light-emitting characteristics such as a field of view.

Since the connection is made in the lower surface of the device, an insulation layer for alleviating the step in the device thickness is not necessary unlike the build-up connection. Therefore, it is possible to reduce a thermal history or stress accompanied by the insulation film formation process and costs, and to improve reliability of the device. In addition, a heat resistant temperature necessary in the device can be lowered.

Particularly, when a device such as an LED having a high light-emitting density of 1 to 10 W/cm2 is fixed using a typical resin insulation film, the resin insulation film is degraded by light, and reliability of the device is degraded. In the present embodiment, it is possible to fix the device to the wiring substrate with a sufficient strength and obtain electric connection without such resin.

In addition, since the self-alignment is performed in the z-direction of the device, the gap between the substrate and the device becomes constant, and the plating thickness is sufficiently reduced in a practical sense. As a result, several millions of devices can be collectively connected using electrolytic plating.

Figure 3:
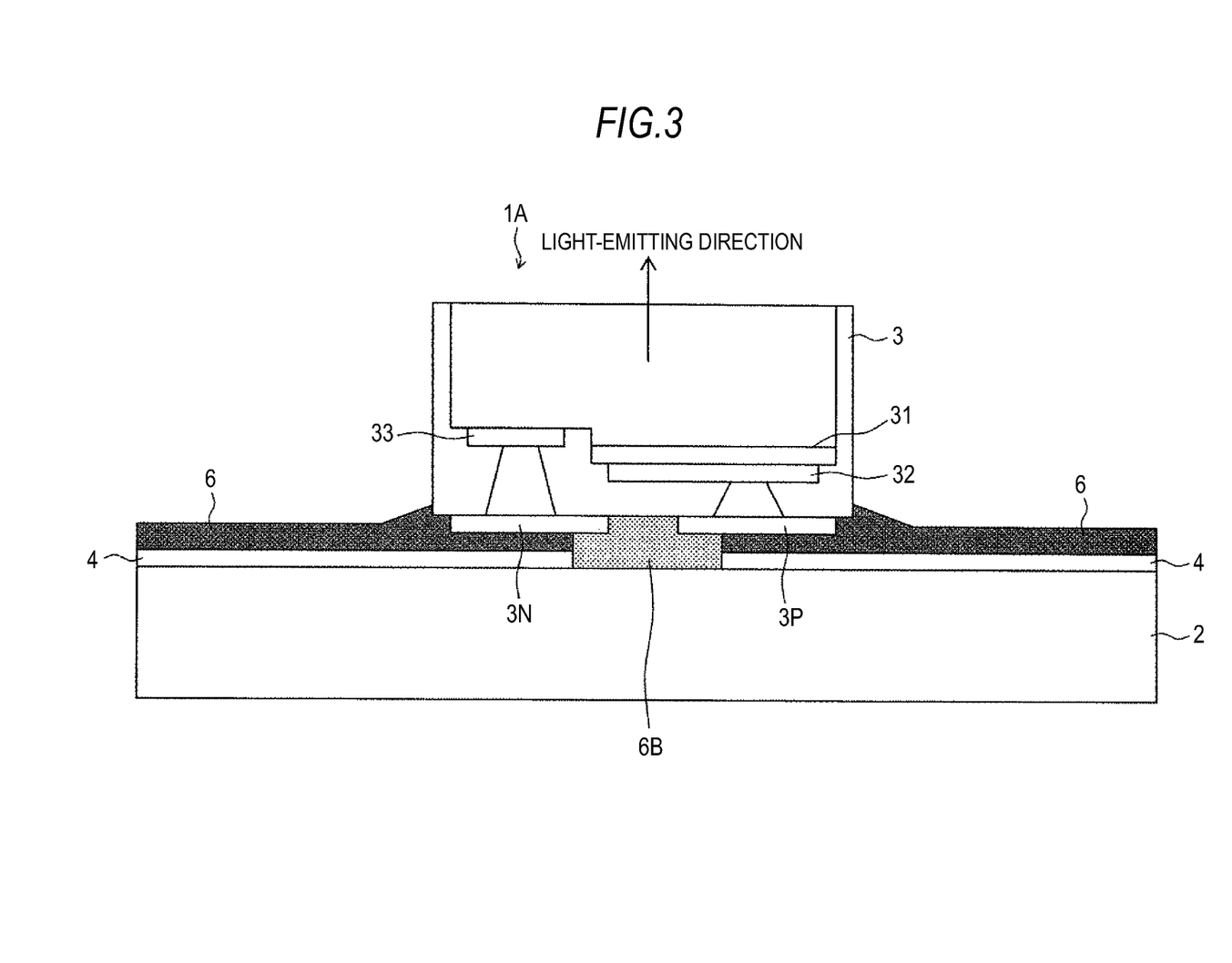
FIG. 3 is a structural diagram illustrating a trio chip according to principles of the present invention(s).

FIG. 3 is a structural diagram illustrating a trio chip 1A according to principles of the present invention(s).

The trio chip 1A shown in FIG. 3 is similar to that shown in FIG. 1G in that the metal wiring layer 4 is formed on the trio substrate 2, and the electrode of the LED chip 3 is bonded to the metal wiring layer 4 using the thermosetting photosensitive resin 6.

In addition, the trio chip 1A shown in FIG. 3 is similar to that shown in FIG. 1G in that a temporary fixing portion 6B as a remaining portion of thermosetting photosensitive resin 6 exists in the opening of the metal wiring layer 4.

This embodiment is different from the previously described embodiment in the structure of the LED chip 3 and a configuration of the wiring line corresponding to the structure of the LED chip 3.

The LED chip 3 shown in FIG. 3 includes a P-electrode 3P and an N-electrode 3N arranged side-by side in the lower surface. In the internal structure, an active layer 31 is formed in the lower surface of the main portion of the substrate, and the internal P-electrode 32 is formed in the active layer 31. Meanwhile, the internal N-electrode 33 is formed in the other side opposite to the one side where a height difference is provided. The internal P-electrode 32 and the internal N-electrode 33 are connected to the P-electrode 3P and the N-electrode 3N, respectively, through plugs having different heights.

The LED chip 3B having such a structure is a top emission type in which light is emitted upwardly. In the top emission type, it is not necessary that the temporary fixing portion 6B has transparency or lightfastness. Therefore, it is advantageous that a wide variety of materials can be selected. Such an advantage is common to the first embodiment.

In addition, since the mounting method itself is common to the previously described embodiment, description thereof will be omitted. In this embodiment, the P-electrode 3P and the N-electrode 3N are positioned in the upward direction from the metal wiring layer 4 to nearly face the metal wiring layer 4 and independently connected to the facing wiring lines 6P and 6N, respectively.

Therefore, in this connection, electrical connections for both the P and N sides are completed, and electrical connections within the trio chip 1A are completed.

Another embodiment, according to principles of the present invention(s), relates to a method of mounting in the panel substrate the trio chip (a fundamental unit of the color pixel configuration) in which the internal LED chip 3 can be mounted in the trio substrate 2 using the method of the first or second embodiment.

Figure 4A:
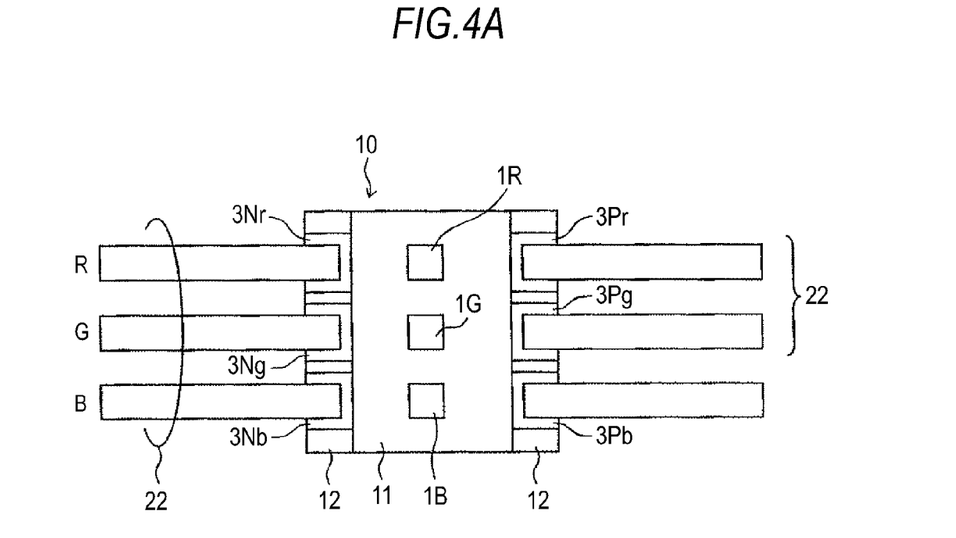
FIGS. 4A and 4B are a plan view illustrating a trio chip according to according to principles of the present invention(s) and a cross-sectional structural diagram illustrating a panel substrate after mounting the same, respectively.
Figure 4B:
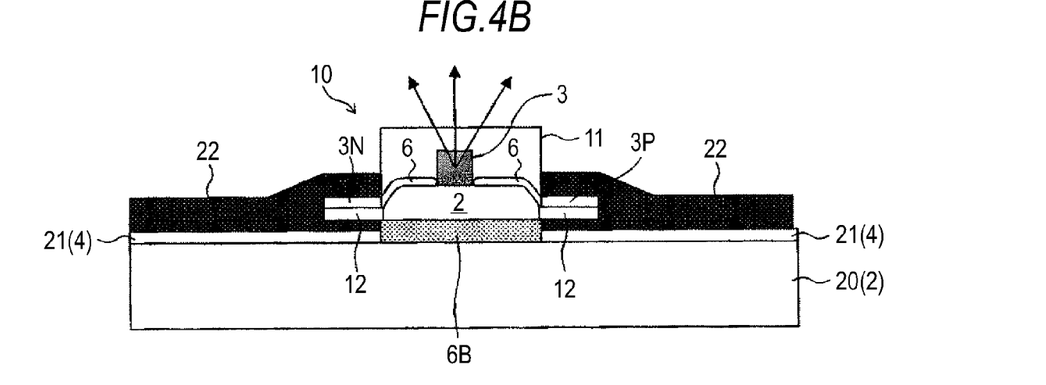

FIGS. 4A and 4B are a plan view illustrating the trio chip 10 and a cross-sectional structural diagram illustrating the panel substrate after mounting the trio chip 10, respectively.

The trio chip 10 shown in FIG. 4A corresponds to an example of the device according to the embodiment of the present invention. In addition, the device denoted by the reference numeral "1" in FIGS. 1A to 1G and the device denoted by the reference number "10" in FIGS. 4A and 4B are similarly called "trio chip." However, for example, the internal configuration obtained by transparently seeing the internal side of FIG. 4B corresponds to that shown in FIGS. 1A to 1G. Referring to FIG. 4B, since the LED chip 3 is formed on the trio substrate 2, and the electrolytic plating layer 5 is extracted from both sides thereof, by way of example, it is assumed that two electrodes are provided in the lower surface of FIG. 3.

In the present embodiment, the electrode pad on the outer surface thereof is bonded to the panel substrate 20 of the display apparatus.

The trio chip 10 of the present example is a top emission type in which light is emitted upwardly. In the top emission type, since the temporary fixing portion 6B is not necessary to have transparency or lightfastness, it is advantageous that a wide variety of materials can be selected.

In addition, since the mounting method itself is common to the first embodiment, description thereof will be omitted.

Here, the trio chip 10 is different from the internal connection pad shown in FIGS. 1A to 1G in the electrode pad that is connecting through plating.

In the trio chip 10, the mainframe portion 11 and the fringe portion 12 under the side wall thereof are protruded in parallel with the substrate surface. The electrode pads 3Nr, 3Nb, and 3Ng for the negative electrodes of RGB colors are provided side by side on the upper surface of the fringe portion 12. In this case, the pad is to be positioned such that the position of the side surface of the electrode is aligned with the protruded apical surface of the fringe portion 12. The requirement that the position of this edge face is aligned is preferable in order to readily make the plating layer grown from the fringe portion 12 contact with the electrode pad, and then, progress the electrolytic plating for the entire surface of the electrode pad.

In addition, it is not intended to exclude the imperfectly aligned case, but the edge face of the electrode may be positioned closer to the mainframe of the device from the protruded edge face of the fringe portion or, reversely, may be further protruded from the fringe portion 12.

In the case where the edge face of the electrode is positioned closer to the mainframe of the device from the protruded edge face of the fringe portion, the thickness of the electrolytic plating layer 22 may be preferably set to be larger than the distances between the edge face of the fringe portion 12 and the apical surfaces of each electrode pad 3N and 3P.

In addition, this embodiment exemplifies the case where each edge face of the P-electrode 3P and the N-electrode 3N is positioned in the upward direction from the metal wiring layer 4 and separated nearly perpendicular to the metal wiring layer 4.

As the plating layer is grown from the upper surface of the metal wiring layer 21, electrical connection between the electrode pad and the plating layer can be obtained after the height becomes equal to that of the fringe portion 12. For this reason, the plating also progresses from the electrode pad thereafter.

Even when the electrode is arranged in other portions than the rear surface of the device in this way, it is possible to obtain excellent robust electrical connection if the electrode is positioned in the upward direction from the seed metal (metal wiring layer 4).

FIGS. 5A to 5G are cross-sectional views illustrating a method of mounting devices in the substrate of an embodiment according to principles of the present invention(s).

The mounting method(s) of the present example is fundamentally common to the method described in than the first described embodiment. However, in the process of exposing a part of the thermosetting photosensitive resin 6 in FIG. 5E, the exposure is made from the top through the path of the mask M provided in the top side. The light (e.g., UV light) transmitting through the internal side of the trio chip 10 from the opening of the mask M is arrives at the thermosetting photosensitive resin 6 underlying the device, and the thermosetting photosensitive resin 6 is partially exposed. As a result, in FIG. 5F after the development, the temporary fixing portion 6B is formed in the exposed portion.

In addition, in the present example, the temporary fixing portion 6B has an area smaller than that of FIGS. 5A to 5G, but the area of the temporary fixing portion 6B may be arbitrarily determined based on the needs of the temporary fixing.

Figure 5A:
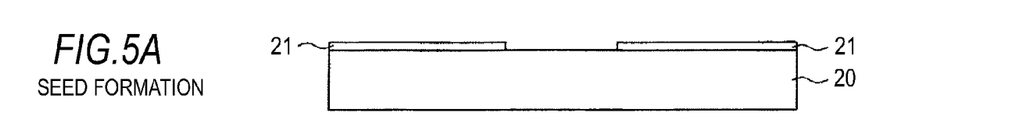
FIGS. 5A to 5G are cross-sectional views illustrating a method of mounting devices in a substrate according to principles of the present invention(s).
Figure 5B:
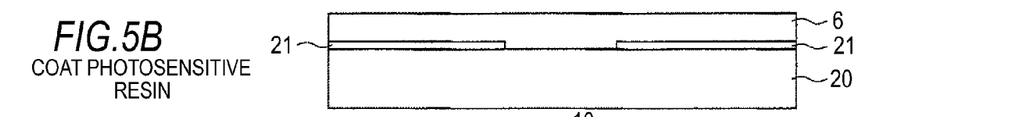
Figure 5C:
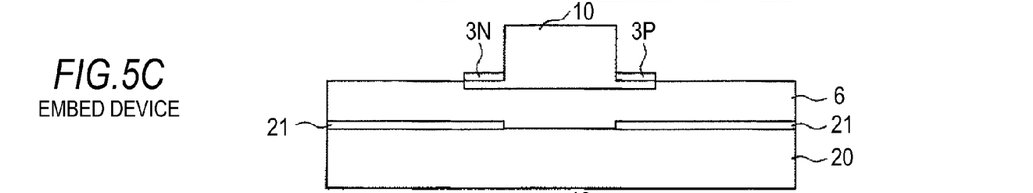
Figure 5D:
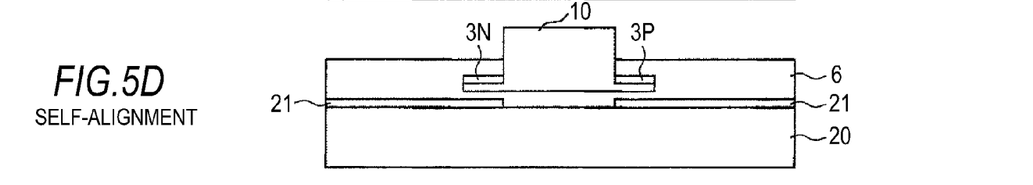
Figures 5E, 5F:
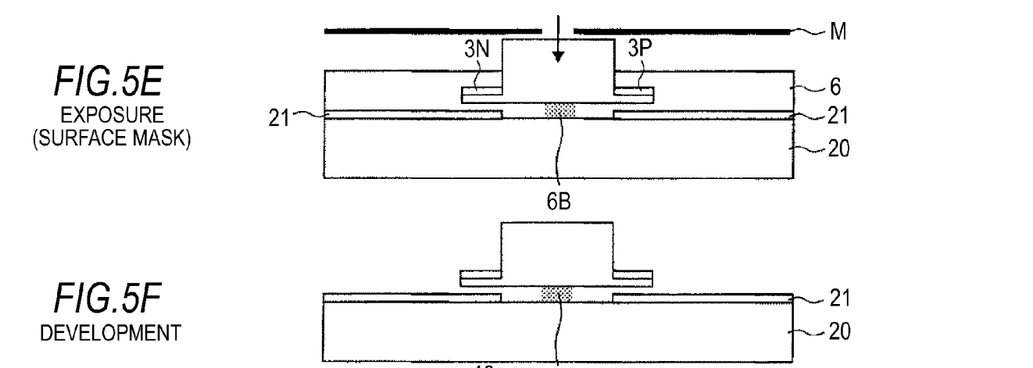
Figure 5G:
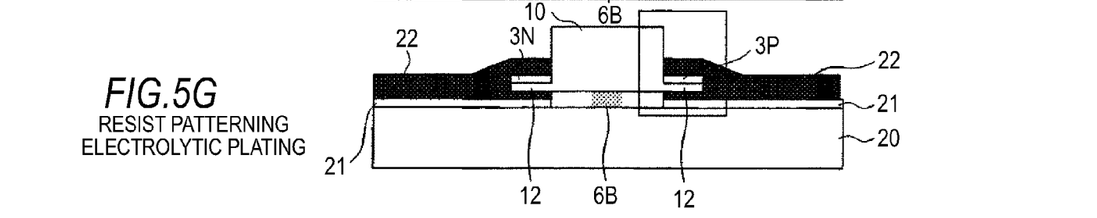

In the plating process of FIG. 5G, as discussed in the third described embodiment, the electrode pad is aligned with the protruded edge face of the fringe portion 12 on the same plane as seen in the plating growth path. For this reason, as the plating grows as much as the height thereof, electrical contact is provided, and the plating grows from the electrode pad.

Therefore, it is easy to form robust bonding at the interface between the electrode pad and the plating layer.

Figure 6:
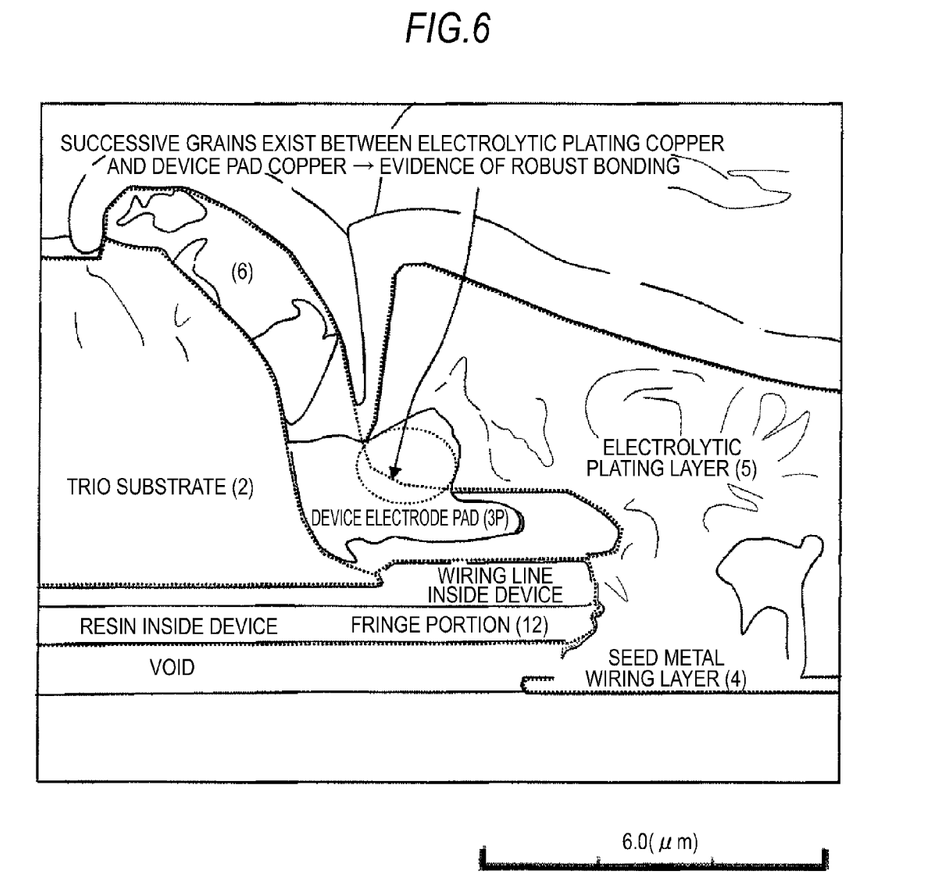
FIG. 6 is a diagram illustrating a picture of the area surrounded by a rectangle of FIGS. 5A to 5G, taken by SIM photographing according to principles of the present invention(s).

FIG. 6 is a diagram illustrating a picture of the area surrounded by a rectangle of FIGS. 5A to 5G, taken by SIM photographing.

It is recognized that successive grains are present in the area surrounded by a circle in FIG. 6 so as to obtain robust bonding.

The trio chip 10 having such a structure is a top emission type in which light is emitted upwardly. In the top emission type, since it is not necessary for the temporary fixing portion 6B to have transparency or lightfastness, it is advantageous in that a wide variety of materials can be selected. Such an advantage is similar to the first embodiment.

In addition, since the mounting method itself is common to the first embodiment, description thereof will be omitted.

The present embodiment relates to modifications of the third and fourth described embodiments.

In the case where the fixing force of the temporary fixing portion 6B is strong, and the temporarily fixing can be sufficiently obtained even in a smaller area, it is possible to apply the bottom emission type.

Figure 7A:
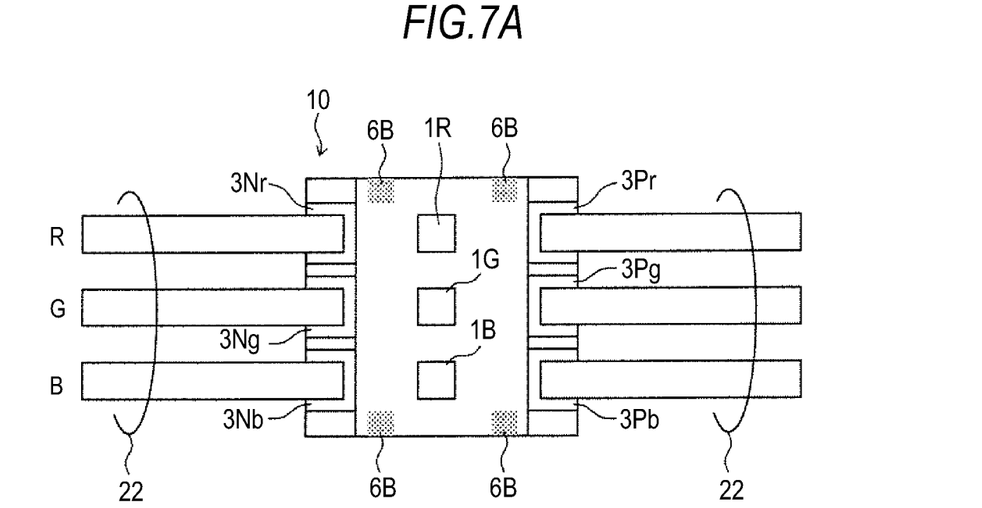
FIGS. 7A and 7B are a plan view illustrating the trio chip according to principles of the present invention(s) and a cross-sectional structural diagram illustrating a panel substrate after mounting the same, respectively.
Figure 7B:
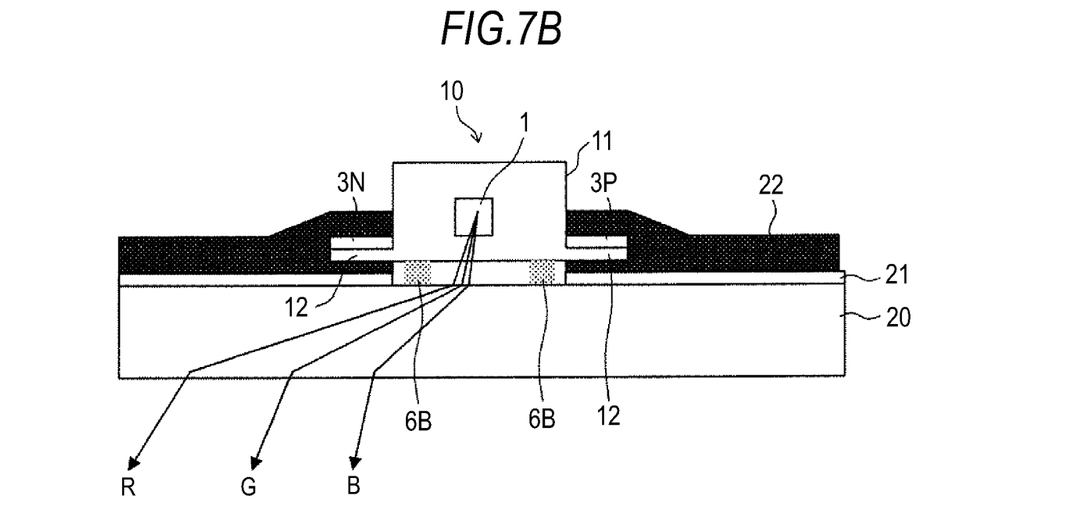

For example, as shown in FIGS. 7A and 7B, the photosensitive resin 6M is arranged in four corners of the trio chip 10 as seen from the plan view. As a result, it is possible to obtain a void structure having an air layer (air gap) from the light-emitting surface of the lower surface of the trio chip 10 to the panel substrate 20.

Accordingly, a difference is generated in the light refraction at an interface between the device and the air gap and the interface between the air gap and the glass substrate (the panel substrate 20) compared with the case where resin is filled therein. Therefore, a difference is generated in the light emission angle within the panel substrate 20.

Figure 8:
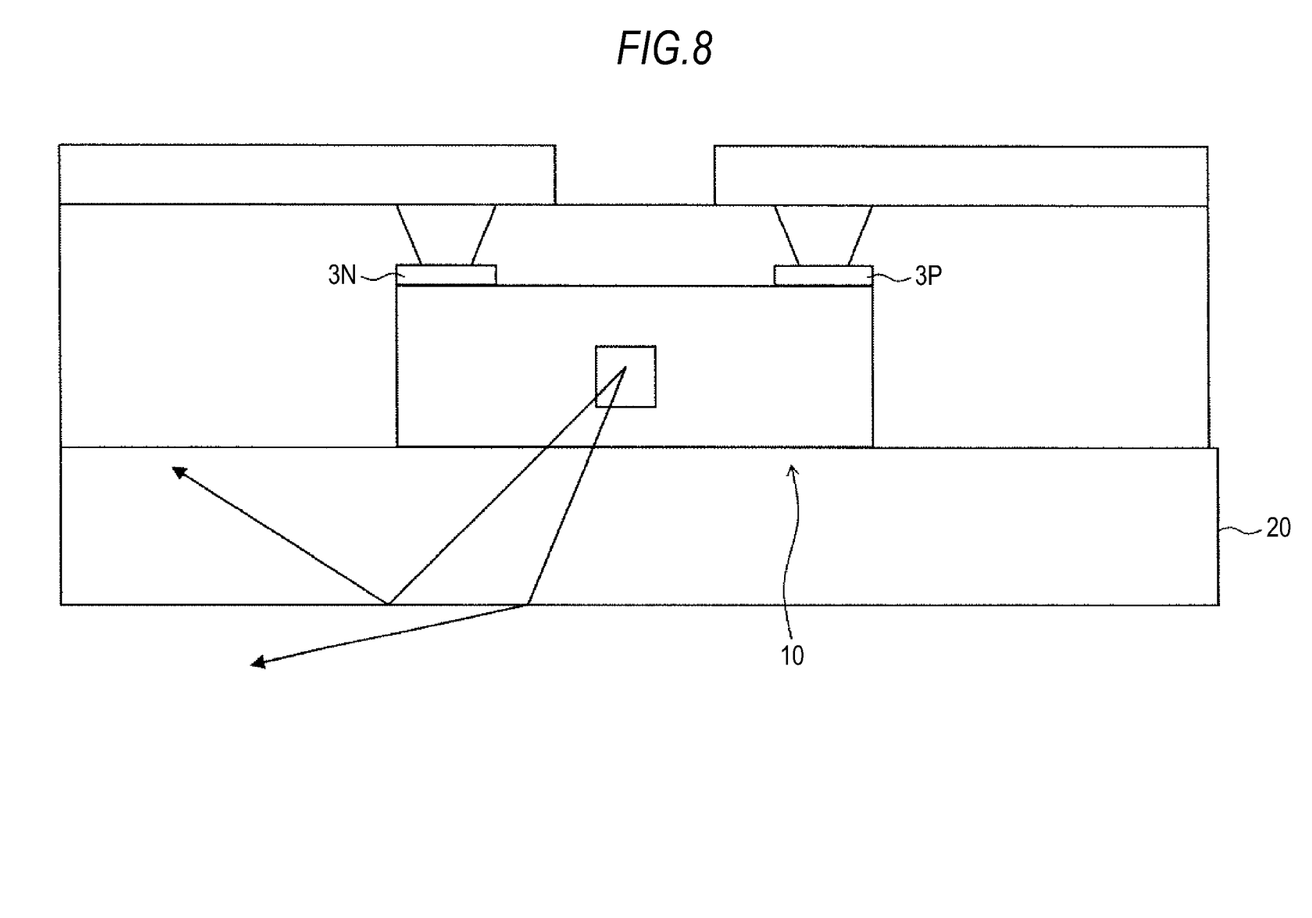
FIG. 8 is a cross-sectional view illustrating a comparison example in which a trio chip is directly mounted on the trio substrate without any air gap.

Specifically, the light is emergent from the glass to the air at an angle of 40 to 45 degrees within the glass, and the light having an angle shallower than that range is totally reflected as shown in FIG. 8 so as to readily generate loss. FIG. 8 illustrates a comparison example in which the trio chip 10 is directly mounted in the panel substrate 20, and the air gap is not provided. In such a mounted structure, the electrode is formed on the device as a via-hole and a wiring line.

If the air gap is not provided, or resin or the like other than the air is interposed, the angle of the light passing through the internal side of the panel substrate 20 becomes shallow as a whole. On the contrary, if the air gap is provided as in the present embodiment, the amount (ratio) of the totally reflected light is reduced. For this reason, it is possible to realize an LED display having a high optical output ratio and low power consumption.

In addition, in the case of the light-emitting device, it is possible to provide both a function of fixing the device and lightfastness. For this reason, the lightfastness becomes unnecessary in the fixed resin if the resin at the place where the light is illuminated is developed and removed after fixing the device, and the electrical connection can be made while the void is maintained. In the build-up type, since the void structure is buried by the relative insulation film, it is difficult to obtain such a structure.

Even in this case, each of the edge faces of the P-electrode 3P and the N-electrode 3N is positioned in the upward direction from the metal wiring layer 21 and separated nearly perpendicular to the metal wiring layer 21.

If, in the course of forming the trio chip 1, the LED chip 3 is barely mounted in the trio substrate 2, and the electrolytic plating layer 5 is grown as described in the first embodiment, the plating is grown to creep up the edge face of the LED chip 3 as shown in FIG. 1G. This is because the effective electric field increases in such a portion.

In FIGS. 9A to 9E, this fact is shown in more detail.

Figure 9A:
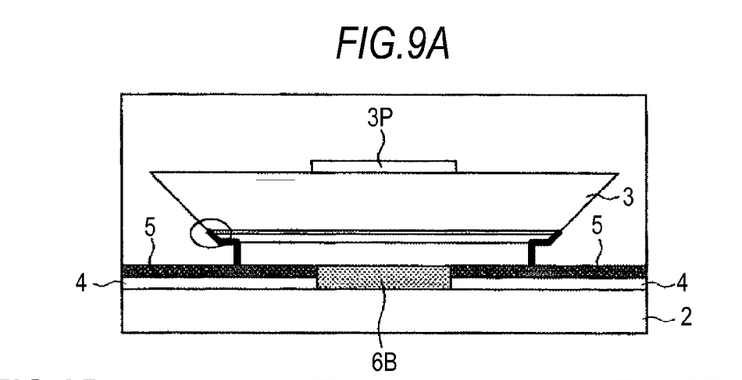
FIGS. 9A to 9E are diagrams illustrating a relationship of the epitaxial structure and the creep-up plating growth on the chip edge face of the semiconductor according to principles of the present invention(s).

If mesa-etching or cleavage is performed for a GaAs substrate as shown in FIG. 9A, the edge face thereof may have a reversed-mesa structure depending on a crystal structure. This fact itself is not substantial, but a speed-up plating growth (creeping-up) is generated also in the vertical semiconductor surface.

FIGS. 9B to 9E schematically illustrate a relationship between a course of growing copper and an epitaxial substrate structure.

In the epitaxial substrate, an updoped multi-layered epitaxial structure for forming multiple quantum wells is interposed, for example, between the n-GaN layer and the p-GaN layer to have about a thickness of 200 nm at maximum as shown in the portion corresponding to the PN junction of the diode in the drawings. There is a difference in the built-in potential (electric potential barrier) in the portion corresponding to the PN junction of such a diode, the contact of the electrolytic plating layer is not influenced unless a difference of the electric potential is generated over the barrier. However, if a voltage exceeding the difference of the built-in potential is applied, the plating growth progresses also in the n-GaN layer as shown in FIG. 9E. Then, the diode characteristic is degraded, and finally, the diode becomes a substantially shorted resistor.

Figures 9B, 9C:
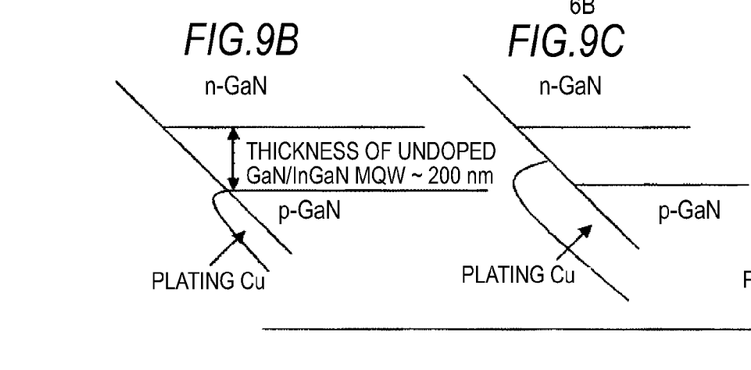
Figure 9D:
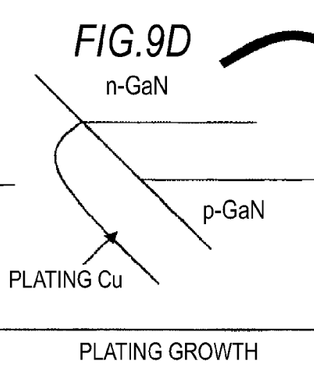
Figure 9E:
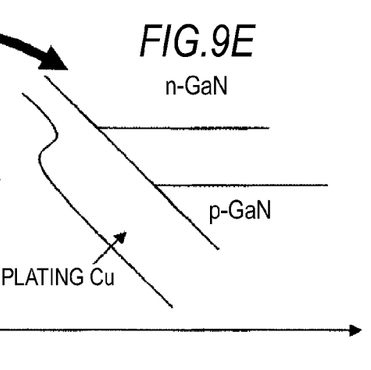

Otherwise, if the plating is thickened as shown in FIGS. 9C to 9D even when a voltage exceeding the difference of the built-in potential is not applied, the p-GaN and the n-GaN may be shorted through the plating film.

In the present modified example, in order to prevent such a phenomenon, it is preferable that the semiconductor LED chip is formed such that the built-in potential of the PN junction is equal to or higher than the voltage (for example, 0.5 to 1 V) applied to the metal wiring layer 4 and the electrolytic solution during the electrolytic plating.

Alternatively, in order to avoid contact, it is preferable that a thin insulation film is formed in the edge face in advance by using a method of coating the edge face in the cleavage surface of the laser diode.

It is possible to prevent degradation of the diode characteristics by selecting at least one of the aforementioned means. In addition, since the thickness of the electrolytic plating can be reduced as described above by applying the present invention, the solution for plating the edge face is dispensable.

An exposure system appropriate to the rear-exposure in various aforementioned embodiments will be described. Such an exposure system is applied to the rear-exposure in the method according to the aforementioned embodiments.

Figure 10:
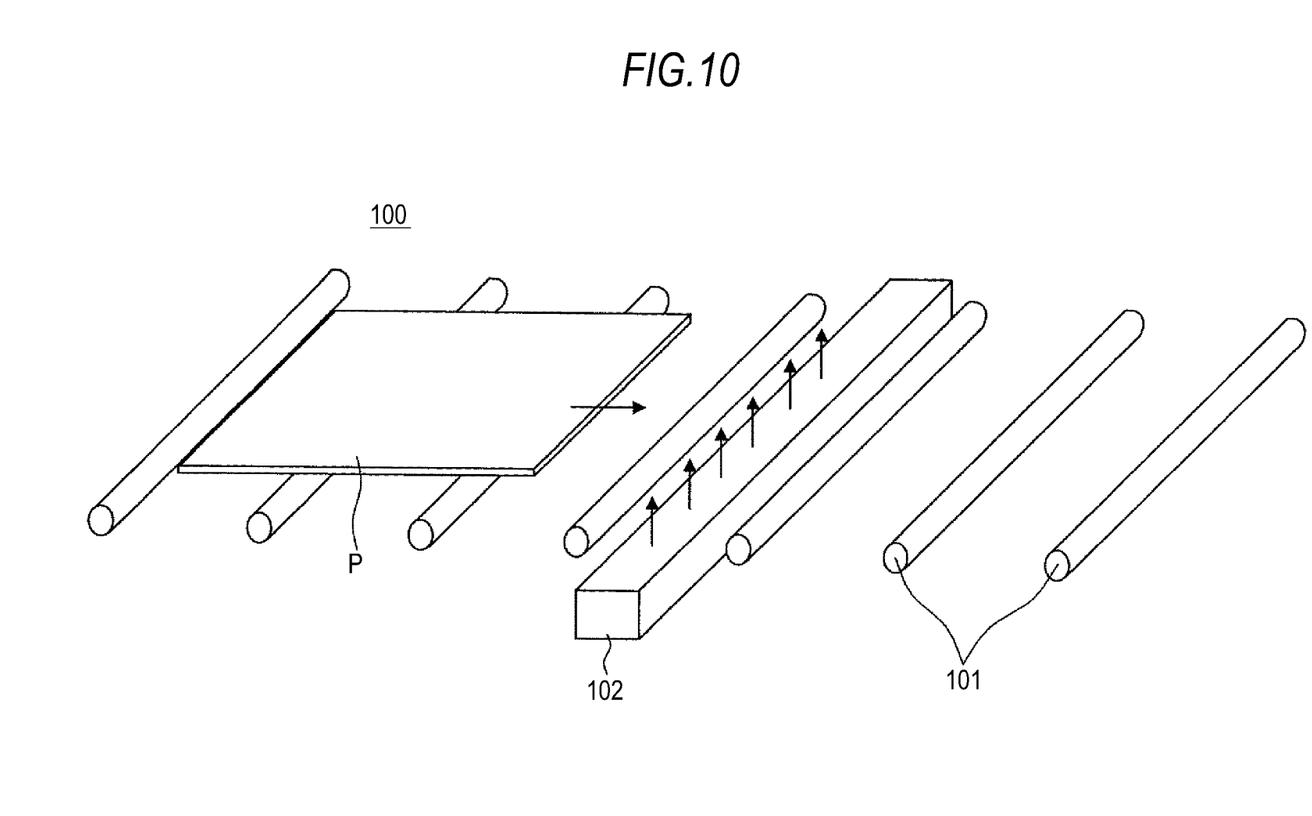
FIG. 10 is a schematic diagram illustrating a delivery exposure system according to principles of the present invention(s).

Characteristically, the exposure system 100 shown in FIG. 10 is integrated with the panel delivery apparatus. Referring to FIG. 10, the line-shaped exposure apparatus 102 is provided in the middle of the delivery path of the large-scaled LED display. The delivery apparatus includes a delivery roller 101 which is axially rotated by controlling the speed, and the LED display panel P is delivered using the delivery roller 101 making contact with the rear surface thereof.

For this reason, when the LED display panel P passes through the line-shaped exposure apparatus 102 in the middle of the delivery, the LED display panel P is exposed from the rear surface using a line scanning method.

In addition, a control roller may be provided over the line-shaped exposure apparatus 102 to allow for feeding with a finer pitch.

Such exposure is appropriate when the resolution of the exposure is not necessarily high or when a separate mask is dispensable because of using the wiring line or the like as a self-alignment mask.

In addition, in the case where the device emits light in the surface side of the LED display panel P, the device can be held only in the rear surface of the device. Therefore, it is possible to prevent optical degradation caused when leakage light is incident to the holding resin.

Furthermore, by performing rear-exposure, a large-scaled expensive exposure apparatus is not necessary.

Moreover, such an exposure apparatus may be applied to apparatuses other than the display if it has an optically transparent substrate.

It should be understood by those skilled in the art that various modifications, combinations, sub-combinations and alterations may occur depending on design requirements and other factors insofar as they are within the scope of the appended claims or the equivalents thereof.

What is claimed is:

1. An assembly comprising:
   a substrate;
   a metal wiring layer on the substrate, the metal wiring layer having an opening therein;
   a first cured thermosetting resin layer portion on at least a portion of the substrate exposed by the opening of the metal wiring layer;
   a device comprising at least one active component (i) on the first cured thermosetting resin layer portion, (ii) positioned over the opening of the metal wiring layer and (iii) secured to the substrate but spaced apart from the metal wiring layer by means of the first cured thermosetting resin layer portion;
   a second cured thermosetting resin layer portion extending around the device and not being overlapped by the device; and
   an electroplating layer (i) on and over the metal wiring layer, (ii) between the device and the metal wiring layer and (iii) partially embedding the device in a portion of the electroplating layer that extends upward from a planar upper surface of the electroplating layer that is disposed on a surface of the metal wiring layer and spaced from the device by the portion of the electroplating layer that extends upward, the electroplating layer electrically interconnecting the metal wiring layer and the device.

2. The assembly of claim 1, wherein the at least one active component is a light emitting diode.

3. An electronic apparatus assembly comprising:
   a substrate;
   a metal wiring layer on the substrate, the metal wiring layer having an opening therein;
   a first cured thermosetting resin layer portion on at least a portion of the substrate exposed by the opening of the metal wiring layer;
   a device comprising at least one active component (i) on the first cured thermosetting resin layer portion, (ii) positioned over the opening of the metal wiring layer, and (iii) secured to the substrate but spaced apart from the metal wiring layer by means of the first cured thermosetting resin layer portion; and
   a second cured thermosetting resin layer portion extending around the device and not being overlapped by the device; and
   an electroplating layer (i) on and over the metal wiring, (ii) between the device and the metal wiring layer, and (iii) partially embedding the device in a portion of the electroplating layer that extends upward from a planar upper surface of the electroplating layer that is disposed on a surface of the metal wiring layer and spaced from the device by the portion of the electroplating layer that extends upward, the electroplating layer electrically interconnecting the metal wiring layer and the device.

* * * * *